(12) United States Patent
Kashiwazaki et al.

(10) Patent No.: US 8,358,514 B2
(45) Date of Patent: Jan. 22, 2013

(54) ELECTRONIC CONTROL DEVICE

(75) Inventors: Atsushi Kashiwazaki, Anjo (JP); Yasumitsu Tanaka, Inazawa (JP)

(73) Assignee: DENSO CORPORATION, Kariya (JP)

( * ) Notice: Subject to any disclaimer, the term of this patent is extended or adjusted under 35 U.S.C. 154(b) by 415 days.

(21) Appl. No.: 12/588,419

(22) Filed: Oct. 15, 2009

(65) Prior Publication Data

US 2010/0097775 A1  Apr. 22, 2010

(30) Foreign Application Priority Data

Oct. 20, 2008 (JP) .................................. 2008-269457
Jun. 1, 2009 (JP) .................................. 2009-132257

(51) Int. Cl.
*H05K 7/00* (2006.01)
*H01L 23/495* (2006.01)

(52) U.S. Cl. ......... 361/813; 361/783; 257/666; 257/669
(58) Field of Classification Search .......... 361/700–710; 257/690–692, 787–790; 174/350–356
See application file for complete search history.

(56) References Cited

U.S. PATENT DOCUMENTS

| | | | | |
|---|---|---|---|---|
| 6,107,690 | A * | 8/2000 | Courtenay et al. ............ | 257/787 |
| 6,191,490 | B1 * | 2/2001 | Huang .......................... | 257/782 |
| 6,201,696 | B1 * | 3/2001 | Shimizu et al. ............... | 361/704 |
| 6,285,079 | B1 | 9/2001 | Kunikiyo | |
| 6,459,145 | B1 * | 10/2002 | Yamada et al. ............... | 257/669 |
| 7,355,126 | B2 * | 4/2008 | Nishikawa et al. ............ | 174/260 |
| 7,525,184 | B2 * | 4/2009 | Shimanuki et al. ............ | 257/678 |
| 2004/0084756 | A1 | 5/2004 | Kawakami et al. | |
| 2005/0062154 | A1 * | 3/2005 | Duchesne et al. ............. | 257/738 |
| 2007/0148341 | A1 * | 6/2007 | Kawakami et al. ............ | 427/211 |
| 2008/0074829 | A1 | 3/2008 | Kashiwazaki | |

FOREIGN PATENT DOCUMENTS

| | | |
|---|---|---|
| JP | A-54-71369 | 6/1979 |
| JP | A-05-36861 | 2/1993 |
| JP | A-11-40710 | 2/1999 |
| JP | A-2002-76201 | 3/2002 |
| JP | A-2006-41071 | 2/2006 |

OTHER PUBLICATIONS

Office Action mailed on Mar. 1, 2011 issued in the Corresponding Japanese Patent Application No. 2009-132257.

* cited by examiner

*Primary Examiner* — Tuan T Dinh
*Assistant Examiner* — Mukund G Patel
(74) *Attorney, Agent, or Firm* — Posz Law Group, PLC

(57) ABSTRACT

In an electronic control device, an electrically-conductive adhesive is arranged on an outer edge portion of a first surface of a circuit board as a stress reducing portion for reducing stress of the circuit board received by a molding resin. An elastic modulus of the electrically-conductive adhesive is lower than that of the circuit board. The electrically-conductive adhesive is covered by an adhesion improving member. When peeling stress is applied to the circuit board from the molding resin, the electrically-conductive adhesive and the adhesion improving member receive the peeling stress to be deformed. Therefore, the peeling stress to the circuit board is reduced.

12 Claims, 13 Drawing Sheets

ELECTRONIC CONTROL DEVICE

CROSS REFERENCE TO RELATED APPLICATION

The present application is based on Japanese Patent Applications No. 2008-269457 filed on Oct. 20, 2008, and No. 2009-132257 filed on Jun. 1, 2009, the disclosures of which are incorporated herein by reference.

FIELD OF THE INVENTION

The present invention relates to an electronic control device molded with a sealing resin (hereinafter, referred to as a molding resin). In the electronic control device, a circuit board is fixedly bonded to a surface of a base member, and an opposite surface of the surface to which the circuit board is fixedly bonded is exposed to outside.

BACKGROUND OF THE INVENTION

Recently, with respect to powertrain control for a vehicle, functions for performing complex control are expected to be sophisticated in order to achieve both a comfortable drive and low-fuel consumption. Furthermore, as the number of electronic control devices is increased, the number of wiring harnesses may be increased and securing a space for mounting various devices becomes difficult. Thus, a module including a mechanical functional component as an object to be controlled integrated with an electronic control device is expected.

Manufacturing a module including a mechanical functional component integrated with an electronic control device has been studied. For example, an electronic control device is mounted in a valve body constructing an oil-hydraulic circuit inside a transmission integrally with a solenoid and various sensors. As examples of such an electronic control device, each of JP-A-2004-119465 corresponding to US 2007/148341 and JP-A-2008-084978 corresponding to US 2008/074829 describes an electronic control device in which a circuit board is sealed by a molding resin.

In an electronic control device described in JP-A-2004-119465, a circuit board on which electronic components are mounted is bonded to a base member constructed of a laminated body of iron-nickel alloy sandwiched by copper, and is cast by a molding resin other than a part of an external connecting terminal and a flange portion arranged at the base member.

In an electronic control device described in JP-A-2008-084978, a circuit board having electronic components on both surfaces thereof is bonded to a base member made of a sintered compact of mixed powder of aluminum and silicon carbide, and is cast by a molding resin other than a part of an external connecting terminal and a part of the base member. The electronic control device has a half mold structure, that is, a surface of the base member that is opposite to a surface of the base member to which the circuit board is bonded is exposed to outside. Thus, radiation performance of the electronic components is improved.

As described in JP-A-2004-119465 and JP-A-2008-084978, a technique to mold an electronic circuit assembly is a conventional technique known for an IC package. However, in a large-size component such as a control circuit for a transmission, stress due to the difference between the amount of heat contraction of a molding resin and components such as a circuit board and a base member is so large that peeling at an interface may be generated. The stress is generated from an outer edge portion of a molded object toward the center thereof.

JP-A-2004-119465 describes a full mold structure, that is, the molding resin covers also a rear surface of the base member. A warpage due to a difference between a linear expansion coefficient of the base member and that of the molding resin is prevented by the full mold structure. Further, the base member is constructed of the laminated body of iron-nickel alloy sandwiched by copper. Therefore, the linear expansion coefficient of the base member is set to be approximately equal to that of the molding resin, and peeling stress is decreased.

JP-A-2008-084978 describes that a size of the circuit board is reduced as much as possible by arranging the electronic components on both surfaces of the circuit board so as to reduce the stress. Further, the base member is made of the sintered compact of mixed powder of aluminum and silicon carbide. Therefore, a linear expansion coefficient of the base member is set to be approximately equal to that of the molding resin, and an elastic modulus can be lowered.

In JP-A-2004-119465 and JP-A-2008-084978, peeling between the circuit board, the base member and the molding resin is prevented by modifying the material or the structure. In contrast, with respect to a large-size molded device, JP-A-2006-041071 describes that a circuit board is covered by an adhesion improving member such as polyamide-imide generally. That is, the circuit board is covered by the adhesion improving member, which has a lower elastic modulus than the molding resin and adhesion. Therefore, sharing stress at an interface of the molding resin is decreased, and the molding resin is unlikely to be peeled off the circuit board.

However, in the full mold structure described in JP-A-2004-119465, the molding resin is arranged on an opposite surface of a surface to which the circuit board is bonded in the base member. Thus, heat generated at the electronic components is released to outside through the flange portion arranged at the base member and exposed to outside from the molding resin, so that radiation performance may be decreased.

Further, in the half mold structure described in JP-A-2008-084978, because a part of the base member is exposed from the molding resin, the radiation performance is improved. However, one surface of the base member is covered by the molding resin, and another surface thereof is not covered by the molding resin. That is, even if the molding resin contracts at one surface of the base member, because the molding resin is not arranged on another surface thereof, it becomes difficult to maintain balance of contraction in the molded device. Thus, it is difficult to prevent the warpage of the molded device as a whole, and reliability in adhesion at an interface of the molding resin may be decreased.

In both structures described in JP-A-2004-119465 and JP-A-2008-084978, the linear expansion coefficients of the molding resin and the base member can be set to be about 8 to 10 ppm/° C. However, a linear expansion coefficient of ceramic used for the circuit board is about 5 to 7 ppm/° C., and it is difficult for the linear expansion coefficients of the molding resin and the base member to set to be approximately equal to that of the circuit board.

Further, a material for a ceramic board is calcined and divided at a V-groove so that the ceramic board as the circuit board is obtained. Thus, an edge portion of the ceramic board takes the form of an acute angle, and the stress is likely to be concentrated at the edge portion. Further, an elastic modulus of the ceramic board is about 250 GPa, and the great stress may be generated at the edge portion.

In the case where the adhesion improving member is used as described in JP-A-2006-041071, the adhesion improving member forms a fillet and is filled in a concavo-convex portion around components on the circuit board by a capillary phenomenon, and thereby the adhesion improving member can be thickened. Thus, it is considered that the stress can be reduced due to low elasticity. However, because a viscosity of the adhesion improving member is low such that the circuit board is uniformly coated with the adhesion improving member by spraying, a thickness of the adhesion improving member at a flat portion such as the edge portion may become small. Although adhesion between the molding resin and the circuit board can be improved, there is a limit to reduce the stress due to the low elasticity.

The peeling stress in the molding resin is generated from an outer edge portion of the circuit board toward the center thereof, and increases with increasing distance from the center of the circuit board. Therefore, as described above, in the case where a circuit size is enlarged by unifying various components and the circuit board becomes larger, the peeling stress applied to the outer edge portion of the circuit board may become larger. Therefore, even when the base member is made of the same material with the molding resin and the adhesion between the molding resin and the circuit board is improved, interfacial peeling at the edge portion of the circuit board cannot be prevented.

If the molding resin is peeled off the circuit board, a position of the molding resin is displaced with respect to the circuit board. Thus, a bonding wire of the electronic component mounted on the circuit board may be cut, for example, so that electronic failure may generate.

SUMMARY OF THE INVENTION

In view of the above points, it is an object of the present invention to provide an electronic control device that has a half mold structure in order to secure radiation performance, and that can prevent interfacial peeling between an edge portion of a circuit board and a molding resin.

According to one aspect of the present invention, an electronic control device includes a circuit board having a first surface and a second surface that is an opposite surface of the first surface, a base member configured to be used as a heat sink, an electronic component mounted on the first surface, a molding resin sealing at least the circuit board and a surface of the base member to which the circuit board is attached, and a stress reducing portion arranged at least on an outer edge portion of the first surface of the circuit board. The base member is bonded to the second surface. The stress reducing portion is configured such that stress of a joint portion between the circuit board and the molding resin via the stress reducing portion at the outer edge portion is lower than stress of a joint portion between the circuit board and the molding resin which are directly bonded to each other. An elastic modulus of the stress reducing portion is lower than an elastic modulus of the circuit board.

In the above configuration, the elastic modulus of the stress reducing portion is lower than the elastic modulus of the circuit board, that is, the stress reducing portion is softer than the circuit board. The stress reducing portion is more likely to deform than the circuit board and can reduce stress received from the molding resin. Therefore, even when peeling stress is applied to an interface between the outer edge portion of the first surface of the circuit board and the molding resin, the peeling stress can be reduced by the stress reducing portion.

The peeling stress in the molding resin is generated from an outer edge portion of the circuit board toward the center thereof. Thus, interfacial peeling at the outer edge portion of the first surface of the circuit board, at which the peeling stress is most likely to be generated in the circuit board, can be prevented.

Therefore, the interfacial peeling between the outer edge portion of the first surface of the circuit board and the molding resin can be prevented.

Further, the electronic control device has a half mold structure, and thereby radiation performance of the electronic component can be improved.

BRIEF DESCRIPTION OF THE DRAWINGS

The above and other objects, features and advantages of the present invention will become more apparent from the following detailed description made with reference to the accompanying drawings. In the drawings.

DETAILED DESCRIPTION OF THE PREFERRED EMBODIMENTS

Figure 1:
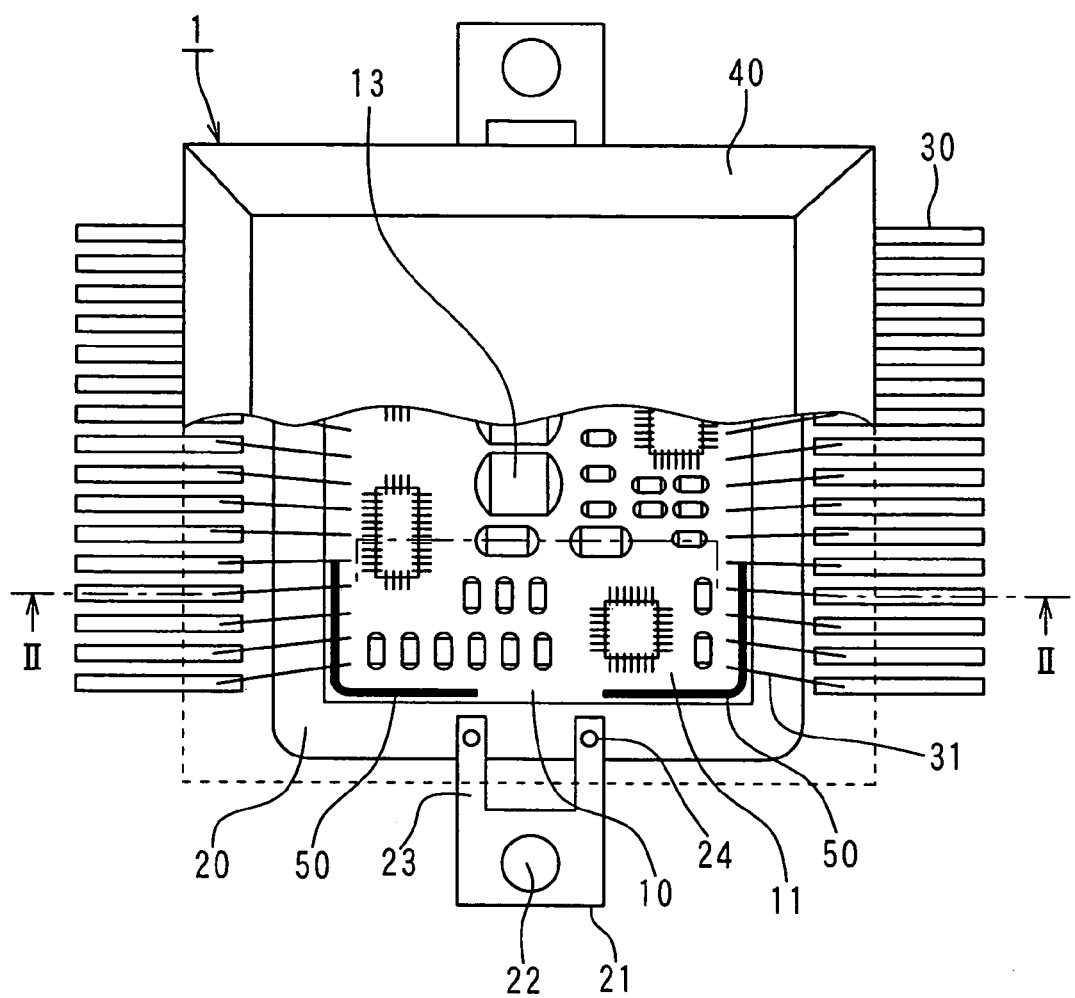
FIG. 1 is a plan view of an electronic control device according to a first embodiment of the present invention.

Hereinafter, embodiments of the present invention will be described with reference to the drawings. In the following embodiments, with respect to the corresponding portion to one described in a precedent embodiment, the same reference numeral is designated:

First Embodiment

Hereinafter, a first embodiment of the present invention will be described with reference to FIGS. 1 to 6. An electronic control device according to the present embodiment is used as an in-vehicle electronic control device, for example. Specifically, the electronic control device is used as an electronic control device for an automatic transmission, and is equipped in a valve body arranged inside the automatic transmission as a module integrated with a solenoid, various sensors and the like.

Figure 2:
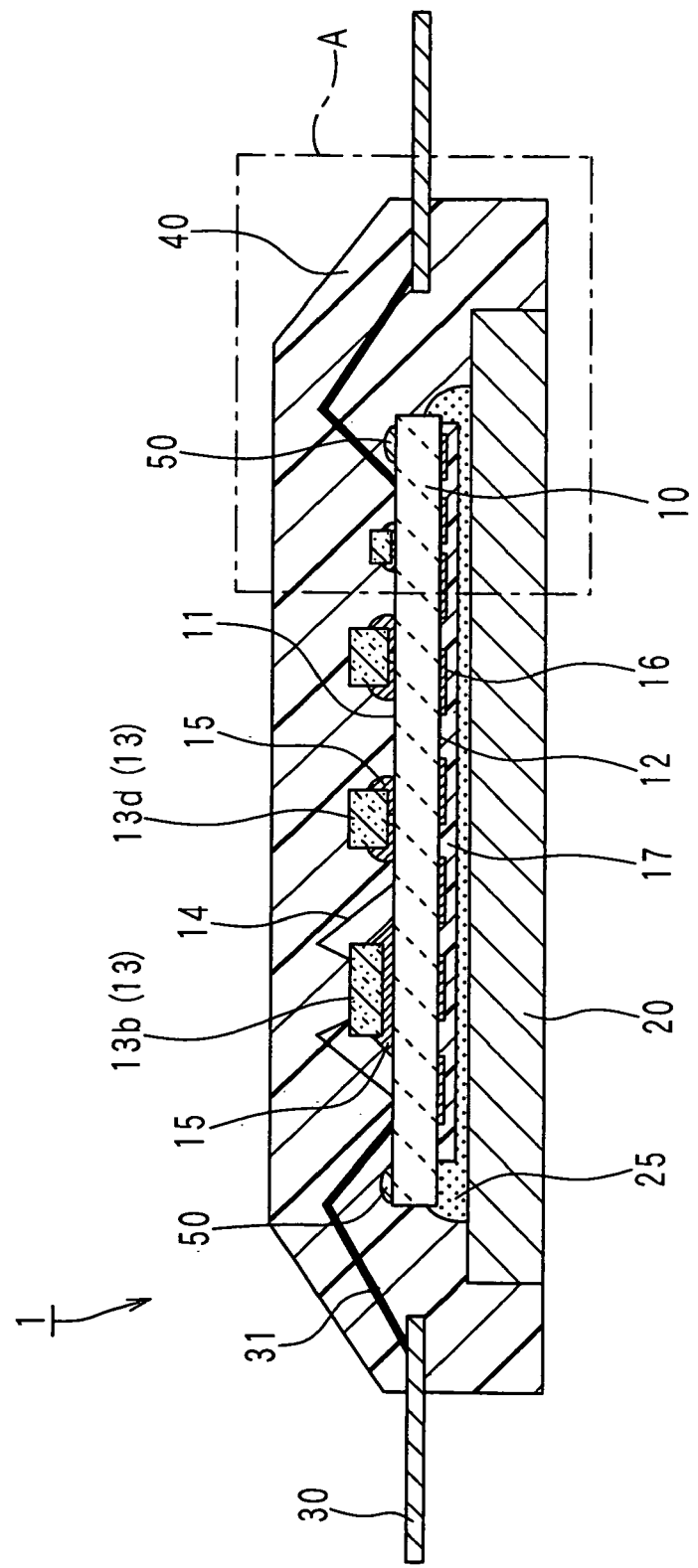
FIG. 2 is a cross-sectional view taken along line II-II in FIG. 1.

FIG. 1 is a plan view of the electronic control device according to the present embodiment. FIG. 2 is a cross-sectional view taken along line II-II in FIG. 1. A part of a molding resin 40 is not shown in FIG. 1. A configuration of an electronic control device 1 will be described with reference to FIGS. 1 and 2.

As shown in FIG. 1, the electronic control device 1 is a molding package having a square-plate shape. As shown in FIGS. 1 and 2, the electronic control device 1 is constructed of a circuit board 10, a base member 20, a lead terminal 30 and the molding resin 40.

The circuit board 10 is a plate-shaped wiring board having a first surface 11 and a second surface 12, which is an opposite surface of the first surface 11. The circuit board 10 is made of ceramic. Specifically, a ceramic multilayer board, which is formed by laminating six ceramic boards each having square planar shape measuring 35 mm by 45 mm, is used as the circuit board 10.

The ceramic multilayer board as the circuit board 10 has thermal conductivity equal to or higher than 10 W/mK, for example. The value is larger than thermal conductivity of a resin board, for example, about 1 W/mK. Thus, radiation performance of the ceramic multilayer board is higher than that of the resin board.

A wiring pattern is provided on the first and second surfaces 11, 12 and inside the circuit board 10. Multiple electronic components 13 are mounted on the first surface 11 of the circuit board 10.

Figure 3:
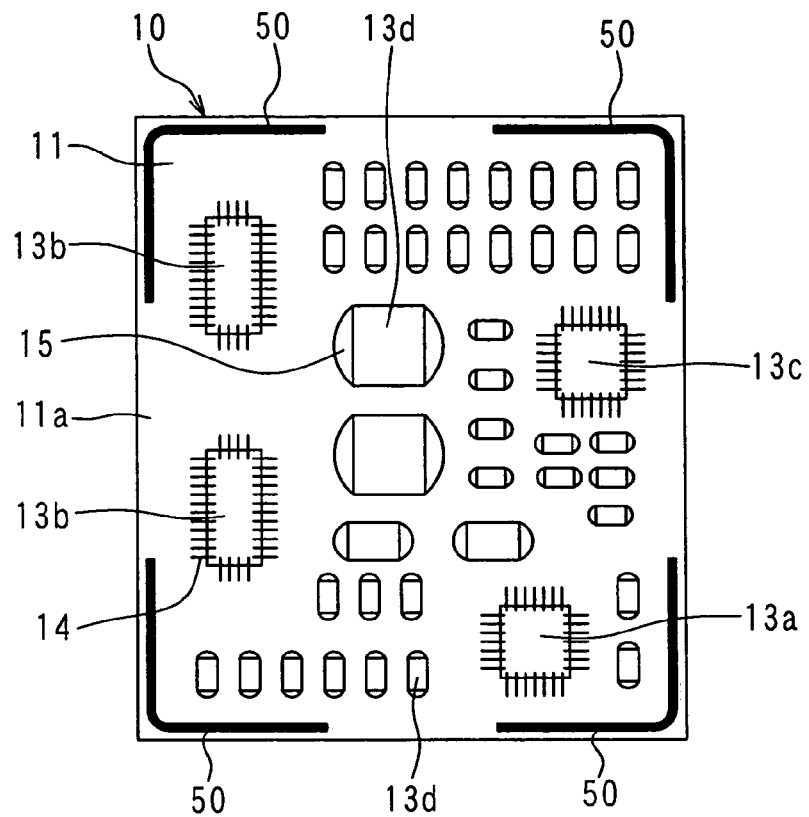
FIG. 3 is a plan view of a first surface of a circuit board.

FIG. 3 is a plan view of the first surface 11 of the circuit board 10. As shown in FIG. 3, a power supply IC 13a, a driver IC 13b, a microcomputer 13c, a passive component 13d and the like as the electronic components 13 are mounted on the first surface 11. The power supply IC 13a generates power supply for an electronic control circuit from a battery power supply and supplies the power supply, and the driver IC 13b drives the solenoid. The microcomputer 13c performs various arithmetic operations, and the passive component 13d includes a ceramic tip resistor, a ceramic multilayer capacitor and the like, each of which configures a part of the circuit.

Each of electrodes of the power supply IC 13a and the driver IC 13b as heater elements having a high heating value is electrically connected to an electrode of the circuit board 10 by a wire 14 such as a gold wire. The power supply IC 13a and the driver IC 13b are bare chips, and are fixedly bonded to the first surface 11 by an electrically-conductive adhesive 15 such as silver paste.

Each electrode of the electronic components 13 other than the power supply IC 13a and the driver IC 13b, which are electrically connected to the electrode of the circuit board 10 by the wire 14, is electrically connected to the electrode of the circuit board 10 by the electrically-conductive adhesive 15.

Further, an electrically-conductive adhesive 50 is provided on an outer edge portion 11a of the first surface 11 as a stress reducing portion for reducing stress of the circuit board 10 received from the molding resin 40. The details of the electrically-conductive adhesive 50 will be described later.

The first surface 11 is covered by an adhesion improving member 60 that has high adhesion to the molding resin 40. The adhesion improving member 60 functions such that the molding resin 40 and the circuit board 10 adhere to each other. The adhesion between the circuit board 10 and the adhesion improving member 60 is high, and the adhesion between the adhesion improving member 60 and the molding resin 40 is high. Thus, the adhesion between the circuit board 10 and the molding resin 40 is improved by the adhesion improving member 60. The adhesion improving member 60 is not shown in FIGS. 2 and 3, and shown in FIG. 6.

The electronic components 13 and the electrically-conductive adhesive 50 as the stress reducing portion are covered by the adhesion improving member 60 so that peeling resistance to the molding resin 40 can be improved. As the adhesion improving member 60, polyamide-imide is used, for example. An elastic modulus of the adhesion improving member 60 is 1 to 5 GPa, and is sufficiently low compared to that of the circuit board 10. Thus, stress received from the molding resin 40 can be reduced.

Figure 4:
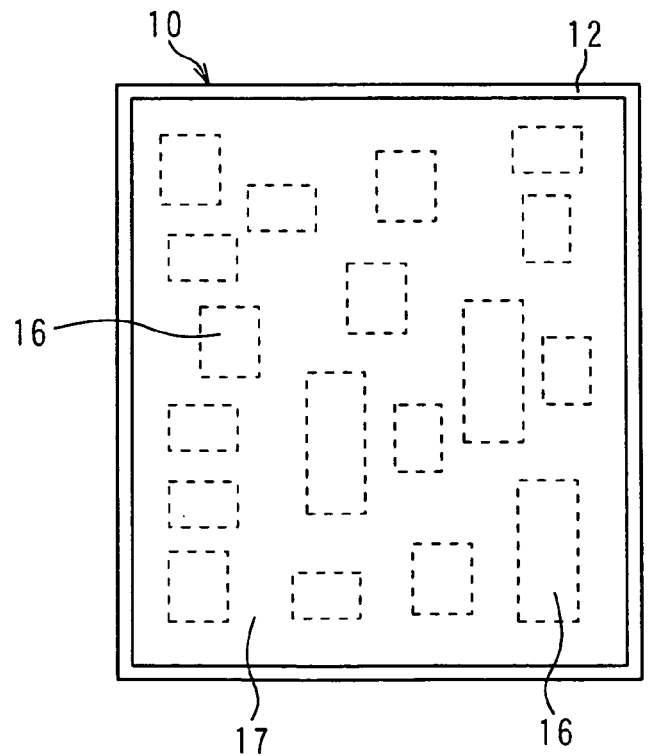
FIG. 4 is a plan view of a second surface of the circuit board.
Figure 5:
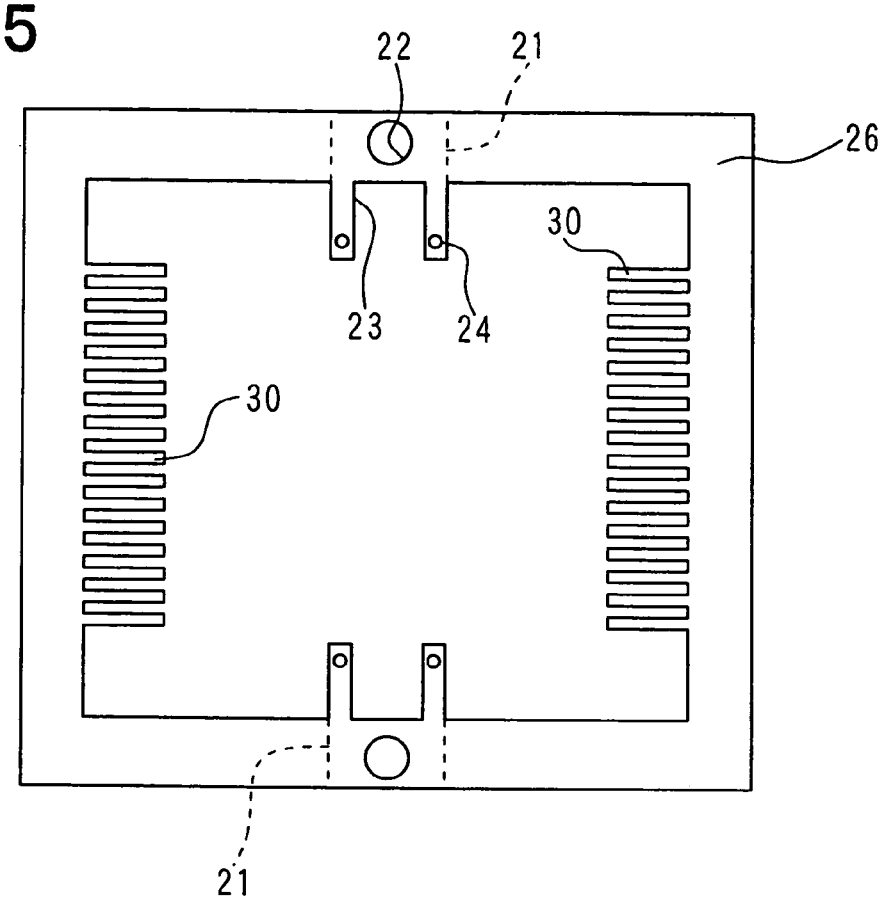
FIG. 5 is a plan view of a lead frame.

FIG. 4 is a plan view of the second surface 12 of the circuit board 10. As shown in FIG. 4, a thick film resistor 16 is formed on the second surface 12 by printing. The thick film resistor 16 is connected to the wiring pattern provided inside the circuit board 10. The thick film resistor 16 is covered by an insulating film 17 such as an ultraviolet curable resin.

A linear expansion coefficient of the circuit board 10 having the above configuration is 5 to 7 ppm/° C., for example. The value is smaller than a linear expansion coefficient of a general resin board, for example, 9 to 17 ppm/° C. A linear expansion coefficient of the electronic components 13 is 3 to 9 ppm/° C., for example. Because a difference between the linear expansion coefficient of the circuit board 10 and that of the electronic components 13 is small, reliability of the connection between the circuit board 10 and the electronic components 13 can be improved. Further, the circuit board 10 made of the ceramic board has higher thermal resistance than the resin board, and reliability of the circuit board 10 under an environment having a high temperature load.

The base member 20 functions as a heat sink, that is, a radiator plate. Further, the base member 20 is a fixation portion to be fixed to a member such as an engine and a transmission, to which the electronic control device 1 is attached.

The base member 20 is fixedly connected to a flange portion 21. A connection portion between the base member 20 and the flange portion 21 is covered by the molding resin 40, and a part of the flange portion 21 is exposed to outside from the molding resin 40. A screw hole 22 for fixing the flange portion 21 to another component by a screw is formed at the part of the flange portion 21 exposed from the molding resin 40.

A stress releasing portion 23 is provided in the flange portion 21 between the screw hole 22 and the molding resin 40. The stress releasing portion 23 is elastically-deformed when stress is transferred in fixing the flange portion 21 to another component so that stress transfer to the molding resin 40 is reduced.

Specifically, the flange portion 21 has two beams that can deflect, and the beams are provided separately each other. Coupling portions 24 are provided near edge portions of the respective beams. By fixing the coupling portions 24 to the base member 20, the flange portion 21 is integrally formed with the base member 20. A part of beams including the coupling portions 24 is sealed by the molding resin 40, and the rest of the flange portion 21 is exposed to outside. Hence, a slit is formed between the molding resin 40 and the flange portion 21 as shown in FIG. 1.

Regions in the beams that are adjacent to a portion, at which the slit is formed, correspond to the stress releasing portion 23. In this manner, by providing the stress releasing portion 23 in the flange portion 21, stress generated in fixing the flange portion 21 to another component of the electronic control device 1 can be reduced by the stress releasing portion 23. Thus, stress transfer to the molding resin 40 is suppressed, and a crack and peeling generated in the molding resin 40 can be reduced.

A sintered compact of aluminum and silicon carbide is used as a material of the base member 20. A linear expansion coefficient of the base member 20 is 8 to 13 ppm/° C., an elastic modulus thereof is 100 to 130 MPa, and thermal conductivity thereof is 150 to 200 W/mK.

A dimension and a shape of the base member 20 are not limited to those of the above-described base member 20. An area of the base member 20 may be equal to that of the first surface 11, and may be larger or smaller than that of the first surface 11. A surface of the base member 20 that is opposed to the circuit board 10 may have the same shape with the first surface 11 or may have a different shape from the first surface 11. In the present embodiment, the base member 20 has a plane rectangle shape. A dimension of the surface of the base member 20 that is opposed to the circuit board 10 is larger than that of the first surface 11 such that the circuit board 10 is fitted in the base member 20 completely when the base member 20 is arranged to be opposed to the circuit board 10. Thus, positioning of the circuit board 10 over the base member 20 becomes easy by using the base member 20 as a standard. Furthermore, heat from the circuit board 10 can be efficiently radiated.

The second surface 12 of the circuit board 10 is fixedly bonded to the base member 20 through an adhesive 25. It is preferable that an adhesive that can fixedly bond the circuit board 10 to the base member 20 and has a property such as thermal resistance required in a use environment is used as the adhesive 25. For example, an adhesive having thermal resistance, high thermal conductivity and an appropriate elastic modulus such that stress generated between the circuit board 10 and the adhesive 25 is reduced and the reliability of the connection can be improved with the circuit board 10 located at a predetermined position can be used. In the present embodiment, a silicone-based adhesion having thermal conductivity of 2.0 to 2.5 W/mK and an elastic modulus at room temperature of 5 to 20 MPa is used as the adhesion 25. When the adhesion 25 is arranged between the circuit board 10 and the base member 20, a clearance between the second surface 12 and the surface of the base member 20 that is opposed to the second surface 12, that is, a thickness of the adhesion 25 is equal to or lower than 0.2 mm.

The lead terminal 30 electrically connects the circuit configured on the circuit board 10 to outside. For example, the lead terminal 30 is electrically connected to the electrode of the circuit board 10 through a wire 31 such as an aluminum wire. The lead terminal 30 may be electrically connected to the circuit of the circuit board 10 without using the wire 31.

The lead terminal 30 is made of the same material with the flange portion 21. Specifically, the flange portion 21 and the lead terminal 30 are configured as a part of a lead frame 26 shown in FIG. 5. For example, the lead frame 26 is made of copper alloy, and the flange portion 21 and the lead terminal 30 are integrated with the lead frame 26.

The coupling portions 24 in the flange portion 21 of the lead frame 26 is connected to the base member 20, which is prepared in another process, by plastic deformation of metal due to pressurization, and the lead frame 26 is fixed to the base member 20. The circuit board 10 is arranged on the base member 20 integrated with the lead frame 26, the lead terminal 30 is electrically connected to the circuit of the circuit board 10, and resin sealing is performed by the molding resin 40. Then, an unnecessary portion of the lead frame 26 other than a portion corresponding to the flange portion 21 and the lead terminal 30 is removed by punching so that the flange portion 21 and the lead terminal 30 are formed. According to the configuration, material cost and process cost can be reduced.

The molding resin 40 protects the circuit board 10 and the connection portion between the circuit board 10 and the lead terminal 30. That is, the molding resin 40 covers the circuit board 10, a part of the base member 20 other than an opposite surface of a surface to which the circuit board 10 is fixedly bonded and the flange portion 21, and a joint portion of the lead terminal 30 between the wire 31 and the electrode of the circuit board 10.

In other words, the opposite surface of the surface to which the circuit board 10 is fixedly bonded in the base member 20, the flange portion 21 and a part of the lead terminal 30 are exposed to outside from the molding resin 40. By exposing a part of the base material 20 from the molding resin 40, a region, at which heat can be directly radiated to outside from the base member 20 without passing through the molding resin 40, is enlarged. Thus, the radiation performance can be improved.

As described above, because the adhesion improving member 60 is arranged on the first surface 11 of the circuit board 10 for protectively covering the electronic components 13 and the like, the molding resin 40 is formed on the adhesion improving member 60 at a side of the first surface 11. Thus, at the side of the first surface 11, adhesion force and reliability in adhesion between the circuit board 10 and the molding resin 40 can be improved.

It is preferable that the molding resin 40 is made of a material that can protect the circuit board 10 and the connection portion between the circuit board 10 and the lead terminal 30 in the use environment. For example, epoxy resin having a linear expansion coefficient of 8 to 10 ppm/° C. and an elastic modulus at room temperature of 12 to 25 GPa can be used. In the present embodiment, the linear expansion coefficients of the base member 20 and the molding resin 40 are set to be 9 ppm/° C., and thereby, the reliability in adhesion is improved.

Figure 6:
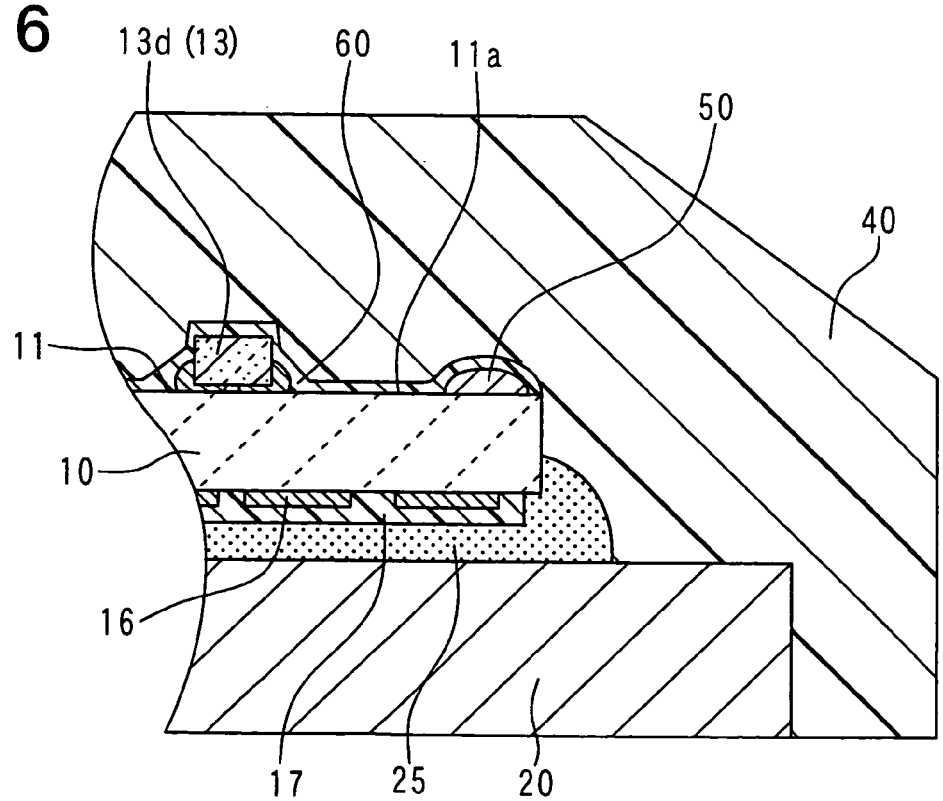
FIG. 6 is an enlarged view of a portion A shown in FIG. 2.

Next, in the above-described configuration, the electrically-conductive adhesive 50 provided on the outer edge portion 11a of the first surface 11 will be described with reference to FIG. 6. FIG. 6 is an enlarged view of a portion A shown in FIG. 2. In FIG. 6, the lead terminal 30 and the wire 31 are not shown. The electrically-conductive adhesive 50 reduces stress due to a difference between the linear expansion coefficient of the circuit board 10 and that of the molding resin 40. Thus, an elastic modulus of the electrically-conductive adhesive 50 is at least lower than that of the circuit board 10.

For example, silver paste is used as the electrically-conductive adhesive 50. An elastic modulus of the silver paste is about 1 to 10 GPa, and that of the circuit board 10 made of the ceramic board is 270 GPa. Hence, the electrically-conductive adhesive 50 is made of a sufficiently softer material than the circuit board 10. The elastic modulus of the molding resin 40 is about 15 GPa. Thus, the elastic modulus of the electrically-conductive adhesive 50 is lower than that of the molding resin 40.

A height of the electrically-conductive adhesive 50 is about 50 μm, for example. As described above, the electrically-conductive adhesive 50 is coated with the adhesion improving member 60. Thus, a height of the electrically-conductive adhesive 50 combined with the adhesion improving member 60 is 50 to 100 μm.

Polyamide-imide is used as the adhesion improving member 60, for example. An elastic modulus of polyamide-imide is about 1 to 10 GPa, and is sufficiently soft compared to the circuit board 10 and the molding resin 40 as with the electrically-conductive adhesive 50. A thickness of the adhesion improving member 60 is about 20 μm, for example. Thus, a stress reducing function by using only the adhesion improving member 60 is low. However, when the electrically-conductive adhesive 50 is coated with the adhesion improving member 60, a fillet is formed and the thickness of the adhesion improving member 60 becomes thick. Thus, the adhesion improving member 60 can function as a stress reducing portion.

That is, the electrically-conductive adhesive 50 and the adhesion improving member 60 lower an elastic modulus of a joint portion between the adhesion improving member 60 and the molding resin 40 over the circuit board 10 at the outer edge portion 11a compared to that at an inner side of the outer edge portion 11a.

In the present embodiment, as shown in FIG. 3, the electrically-conductive adhesives 50 are arranged respectively at four corners of the outer edge portion 11a of the first surface 11 in the form of an L-shape. The four corners correspond to positions located farthest from the center of the first surface 11, and the electrically-conductive adhesives 50 are arranged at the positions. This is because peeling stress generated in the molding resin 40 increases with increasing distance from the center of the circuit board 10.

In the present embodiment, the electrically-conductive adhesive 50 is covered by the adhesion improving member 60. Thus, as shown in FIGS. 3 and 6, the adhesion improving member 60 forms the fillet at an outermost edge portion of the first surface 11. Therefore, the adhesion improving member 60 for reducing stress can be arranged at the outermost edge portion located farthest from the center of the circuit board 10. Alternatively, the electrically-conductive adhesive 50 may be located at the outermost edge portion.

The electrically-conductive adhesive 50 is arranged 0.3 mm apart from the outermost edge portion of the first surface 11, and a width thereof is 0.7 mm. A length of the electrically-conductive adhesive 50 at one side is about 15 mm. Because the electrically-conductive adhesive 50 is arranged in the form of the L-shape, a length overall thereof is about 30 mm. The electrically-conductive adhesive 50 is formed by the same manner in a process of printing the electrically-conductive adhesive 15 that bonds the electronic components 13 to the circuit board 10.

As described above, the peeling stress of the molding resin 40 to the circuit board 10 can be reduced by arranging the electrically-conductive adhesive 50 and the adhesion improving member 60 as the stress reducing portion on the first surface 11. The function of reducing the peeling stress will be described.

Firstly, temperature of the electronic control device 1 is increased, and the molding resin 40, the circuit board 10 and the like respectively expand or contract according to the linear expansion coefficients thereof. As described above, because the difference between the linear expansion coefficient of the molding resin 40 and that of the circuit board 10 is large, the soft molding resin 40 is more likely to deform than the hard circuit board 10. Therefore, the peeling stress from the outer edge toward the center of the circuit board 10 is generated in the molding resin 40.

The peeling stress increases with increasing distance from the center of the circuit board 10 at the first surface 11. Thus, the great peeling stress is applied to the outer edge portion 11a of the first surface 11 of the circuit board 10.

However, the electrically-conductive adhesive 50 and the adhesion improving member 60 having lower elastic moduli than the circuit board 10 are arranged on the outer edge portion 11a of the first surface 11. By arranging the electrically-conductive adhesive 50 and the adhesion improving member 60, stress of a joint portion between the circuit board 10 and the molding resin 40 at the outer edge portion 11a becomes lower than that without the electrically-conductive adhesive 50 and the adhesion improving member 60. Therefore, the electrically-conductive adhesive 50 and the adhesion improving member 60 receive the peeling stress to be deformed, and thereby the peeling stress to the circuit board 10 is reduced.

Inventors prepared the electronic control device 1 having the electrically-conductive adhesive 50 and the adhesion improving member 60 as the stress reducing portion, and an electronic control device without the electrically-conductive adhesive 50 and the adhesion improving member 60. The respective electronic control devices are cooled to −40° C. and heated to 150° C., and the cycle is repeated 4000 times. Ultrasonic flaw images of the electronic control devices were obtained nondestructively by SAT (Scanning Acoustic Tomography).

In the electronic control device without the electrically-conductive adhesive 50 and the adhesion improving member 60, peeling between the circuit board 10 and the molding resin 40 is generated. In contrast, in the electronic control device 1 having the electrically-conductive adhesive 50 and the adhesion improving member 60, peeling between the circuit board 10 and the molding resin 40 is not generated. According to the result, the peeling stress can be reduced by providing the electrically-conductive adhesive 50 and the adhesion improving member 60.

As described above, even when the stress that peels the molding resin 40 from the circuit board 10 may be generated at an interface between the circuit board 10 and the molding resin 40, the interfacial peeling can be restricted by the electrically-conductive adhesive 50 and the adhesion improving member 60.

Because the electrically-conductive adhesive 50 and the adhesion improving member 60 have lower elasticity than not only the circuit board 10 but also the molding resin 40, the electrically-conductive adhesive 50 and the adhesion improving member 60 are more likely to deform than the molding resin 40. Thus, the peeling stress of the molding resin 40 can be reduced.

The electrically-conductive adhesive 50 and the adhesion improving member 60 as the stress reducing portion are arranged at the outermost edge portion of the first surface 11, at which the largest peeling stress is applied. Therefore, the interfacial peeling between the circuit board 10 and the molding resin 40 can be more effectively restricted.

The interfacial peeling between the circuit board 10 and the molding resin 40 can be restricted, and peeling of the molding resin 40 from the circuit board 10 can be restricted.

In addition to reducing the peeling stress by the electrically-conductive adhesive 50 and the adhesion improving member 60, the reliability in adhesion between the circuit board 10 and the molding resin 40 by the adhesion improving member 60 can be improved.

The electronic control device 1 has a half mold structure, that is, the base member 20 is exposed from the molding resin 40, and thereby, the radiation performance of the electronic components 13 can be improved.

In the present embodiment, the electrically-conductive adhesive 50 and the adhesion improving member 60 corresponds to the stress reducing portion. However, the stress reducing portion is not limited thereto.

Second Embodiment

Figure 7:
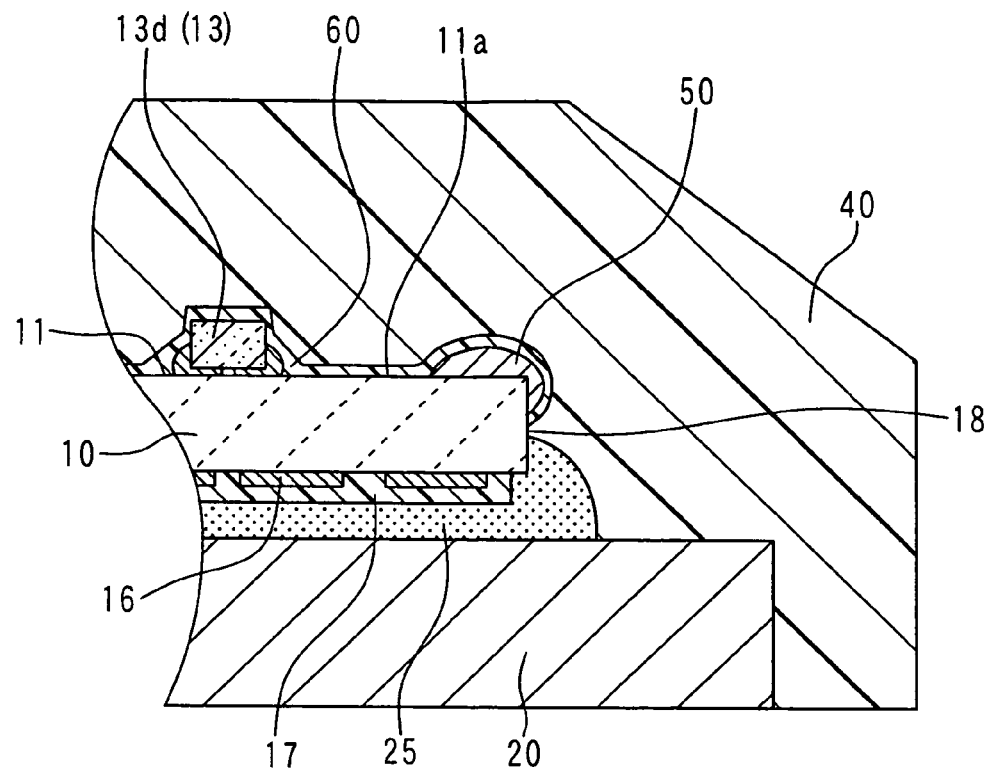
FIG. 7 is an enlarged view of a portion of an electronic control device according to a second embodiment of the present invention.

In the present embodiment, only a different part from the first embodiment will be described. FIG. 7 is an enlarged view of a portion of the electronic control device 1 according to the present embodiment, and corresponds to the portion A shown in FIG. 2.

As shown in FIG. 7, the electrically-conductive adhesive 50 is formed also on a lateral surface 18 of the circuit board 10. Specifically, the electrically-conductive adhesive 50 completely covers a corner portion configured by the first surface 11 and the lateral surface 18 adjacent to the first surface 11, and the electrically-conductive adhesive 50 is coated with the adhesion improving member 60.

The peeling stress in the molding resin 40 is generated from the outer edge portion 11a including the lateral surface 18 toward the center of the circuit board 10. However, because the corner portion of the circuit board 10 is completely covered by the electrically-conductive adhesive 50 and the adhesion improving member 60 as described above, the peeling stress applied to the lateral surface 18 can also be reduced. Therefore, the peeling stress at the lateral surface 18 can be reduced, and the reliability in adhesion between the circuit board 10 and the molding resin 40 can be improved.

Third Embodiment

Figure 8:
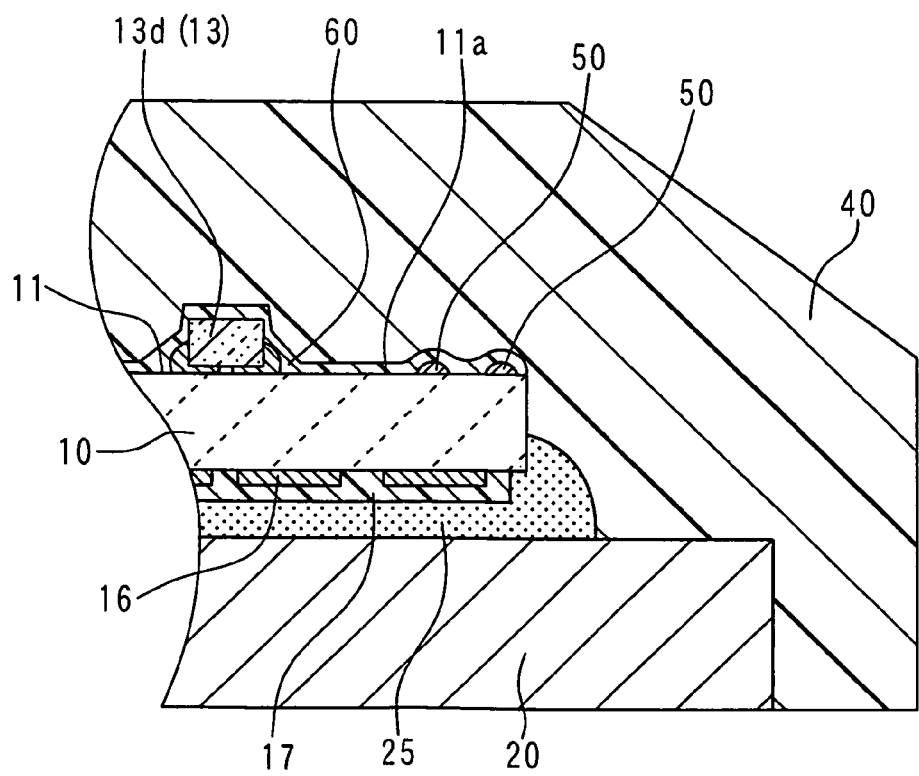
FIG. 8 is an enlarged view of a portion of an electronic control device according to a third embodiment of the present invention.

In the present embodiment, only a different part from the first embodiment will be described. FIG. 8 is an enlarged view of a portion of the electronic control device 1 according to the present embodiment, and corresponds to the portion A shown in FIG. 2. As shown in FIG. 8, the electrically-conductive adhesives 50 are arranged in two rows, and the electrically-conductive adhesives 50 are coated with the adhesion improving member 60.

In the case where the electrically-conductive adhesives 50 are arranged in multiple rows, the adhesion improving member 60 is more likely to accumulate between the adjacent electrically-conductive adhesives 50. Thus, the adhesion improving member 60 can be thickened, and the effect of reducing the stress can be improved.

The configuration of the electrically-conductive adhesives 50 is not limited to two rows. As far as a space for the outer edge portion 11a of the first surface 11 is available, the electrically-conductive adhesives 50 may be arranged in three or more rows.

Fourth Embodiment

Figure 9:
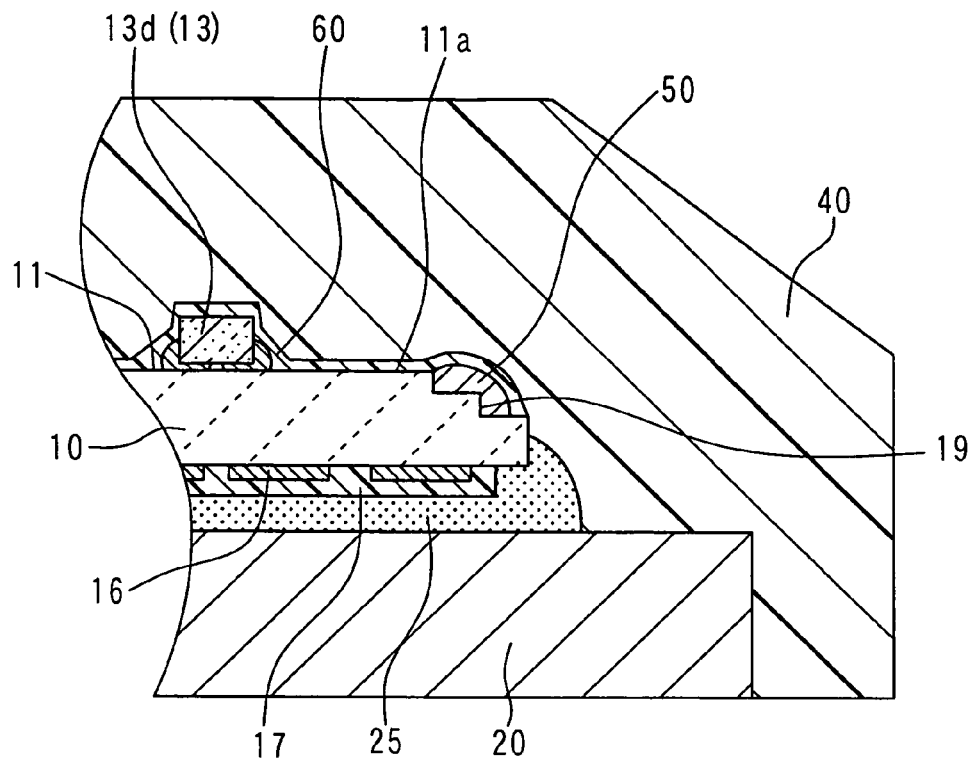
FIG. 9 is an enlarged view of a portion of an electronic control device according to a fourth embodiment of the present invention.

In the present embodiment, only a different part from the first embodiment will be described. FIG. 9 is an enlarged view of a portion of the electronic control device 1 according to the present embodiment, and corresponds to the portion A shown in FIG. 2. As shown in FIG. 9, the circuit board 10 has a stepped portion 19 configured by plane portions and side portions at the outer edge portion 11a of the first surface 11. The electrically-conductive adhesive 50 as the stress reducing portion is arranged on the stepped portion 19, and is coated with the adhesion improving member 60.

The circuit board 10 as the ceramic multilayer board is constructed of six boards each having a thickness of 0.2 mm. The stepped portion 19 is divided into two top layers, two middle layers and two bottom layers. An end of the top layers is located 1.0 mm inside of an end of the bottom layers, and an end of the middle layers is located 0.5 mm inside of the end of the bottom layers. Thus, a step portion having a width of 0.5 mm and a height of 0.4 mm can be formed in the stepped portion 19.

In this manner, by forming the stepped portion 19 at an end of the circuit board 10, the peeling stress concentrated at the end of the circuit board 10 can be dispersed. By arranging the electrically-conductive adhesive 50 and the adhesion improving member 60 as the stress reducing portion at such the position, the peeling stress can be effectively reduced.

Although the stepped portion 19 shown in FIG. 9 has two steps, the number of steps may be one or three or more.

Fifth Embodiment

Figure 10:
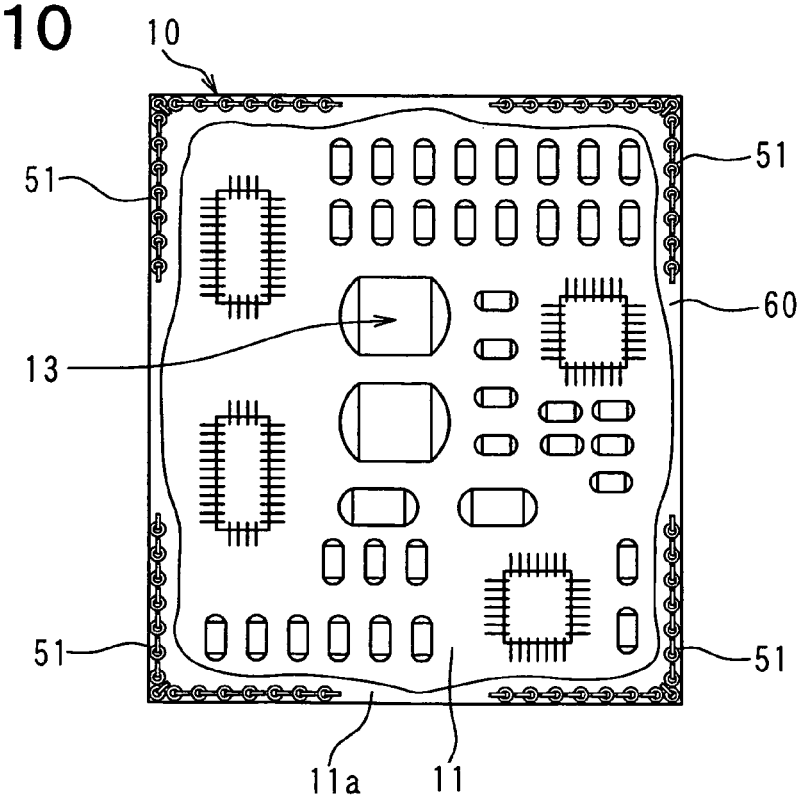
FIG. 10 is a plan view of a circuit board of an electronic control device according to a fifth embodiment of the present invention.
Figure 11:
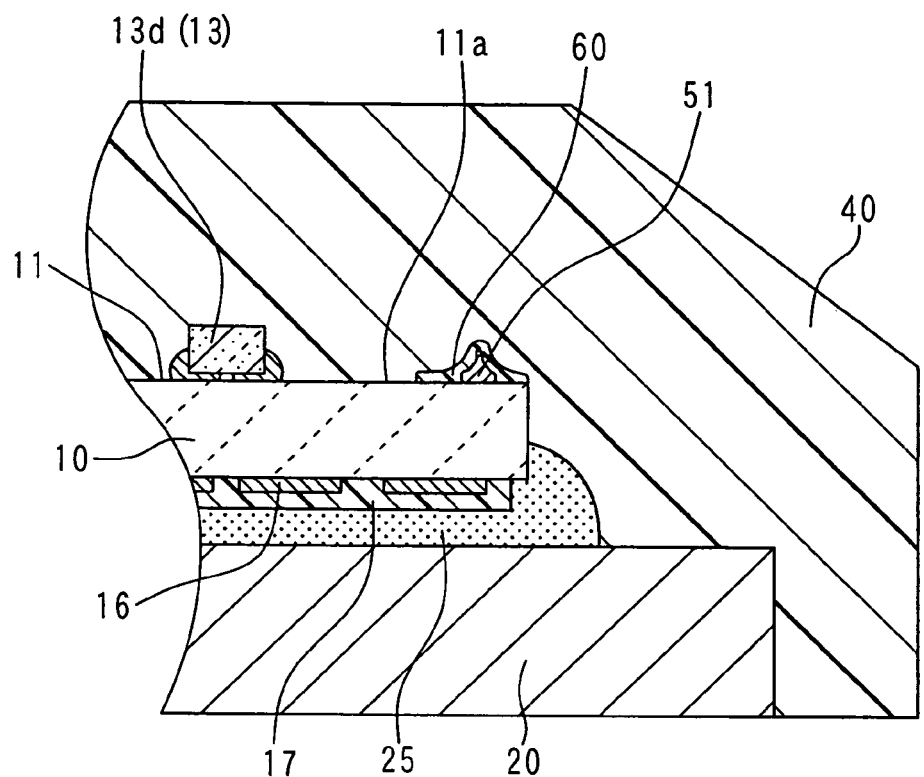
FIG. 11 is an enlarged view of a portion of the electronic control device according to the fifth embodiment of the present invention.

In the present embodiment, only a different part from the first embodiment will be described. FIG. 10 is a plan view of the circuit board 10 according to the present embodiment. FIG. 11 is an enlarged view of a portion of the electronic control device 1 according to the present embodiment, and corresponds to the portion A shown in FIG. 2.

As shown in FIG. 10, multiple bonding portions 51 are arranged on the outer edge portion 11a of the first surface 11. The bonding portion 51 are made of a gold bonding wire that is used when the power supply IC 13a, the driver IC 13b and the like mounted on the first surface 11 are electrically connected to the electrode of the circuit board 10. The bonding portions 51 are formed in a bonding process of the power supply IC 13a, the driver IC 13b and the like. By using the existing process, a new process does not need to be added.

As shown in FIG. 11, the bonding portion 51 is covered by the adhesion improving member 60. In the present embodiment, the adhesion improving member 60 is formed to cover the respective bonding portions 51 only at the outer edge portion 11a of the first surface 11 of the circuit board 10. A maximum height of the bonding portion 51 coated with the adhesion improving member 60 is about 100 µm, for example.

In the present embodiment, the adhesion improving member 60 is arranged only at the outer edge portion 11a, at which the large peeling stress is concentrated. However, as shown in the above embodiments, the adhesion improving member 60 may be arranged all over the first surface 11.

Figure 12:
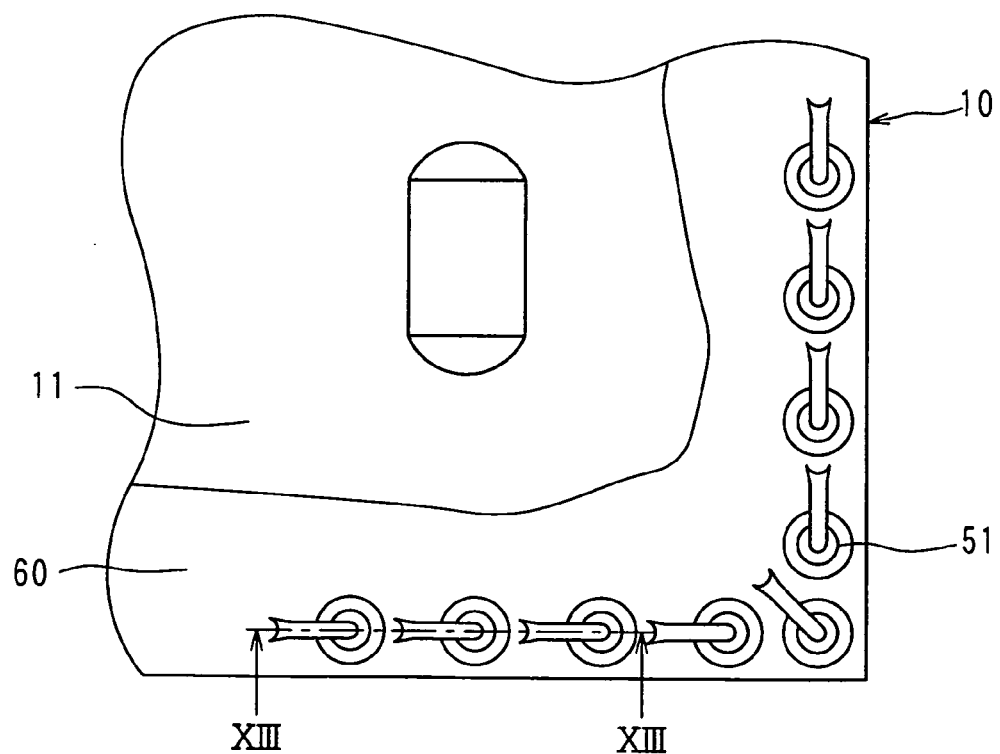
FIG. 12 is an enlarged view of one of four corners of a first surface of the circuit board shown in FIG. 10.

FIG. 12 is an enlarged view of one of four corners of the first surface 11 of the circuit board 10. As shown in FIG. 12, each of the bonding portions 51 is arranged on the circuit board 10 in the form of an L-shape.

Figure 13:
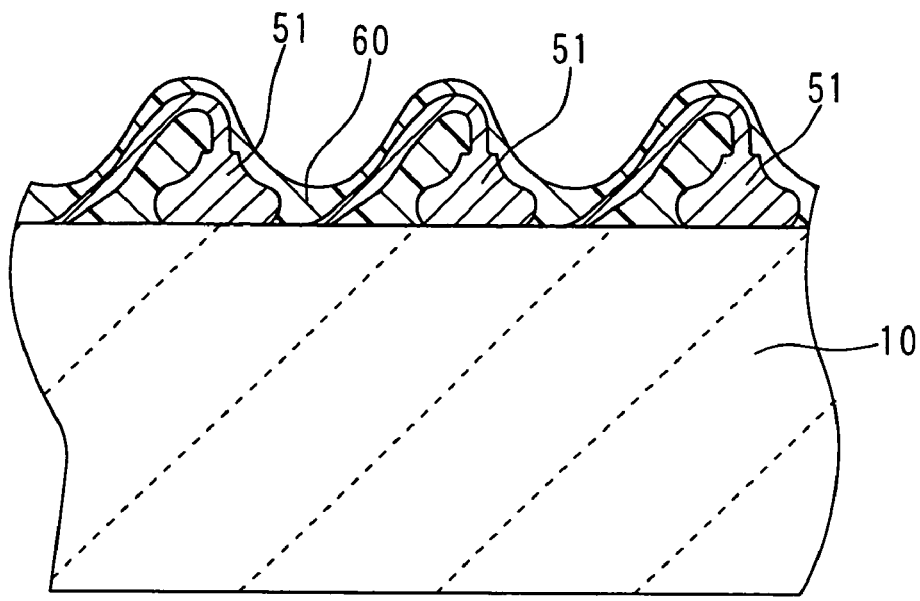
FIG. 13 is a cross-sectional view taken along line XIII-XIII in FIG. 12.

FIG. 13 is a cross-sectional view taken along line XIII-XIII in FIG. 12. As shown in FIG. 13, the adhesion improving member 60 forms a fillet or a film by a concavo-convex portion of the bonding portion 51. A clearance formed in the bonding portion 51 is filled with the adhesion improving member 60 by a capillary phenomenon. Further, the adhesion improving member 60 is accumulated between the adjacent bonding portions 51. In this manner, the adhesion improving member 60 is accumulated at stepped portions and the clearance formed by the bonding portions 51 so that the adhesion improving member 60 can be thickened.

Because the adhesion improving member 60 has low elasticity, the peeling stress of the molding resin 40 applied to the outer edge portion 11a of the circuit board 10 can be reduced. Further, the reliability in adhesion between the circuit board 10 and the molding resin 40 can be improved.

Sixth Embodiment

Figure 14:
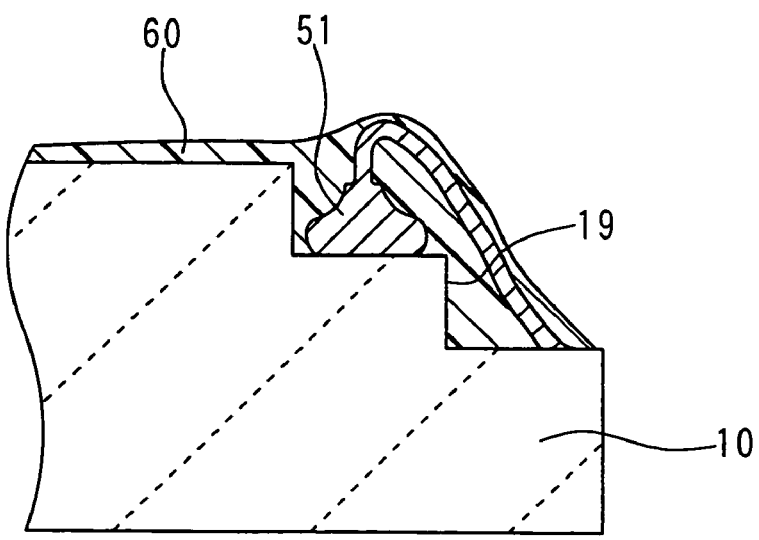
FIG. 14 is an enlarged view of a portion of an electronic control device according to a sixth embodiment of the present invention.

In the present embodiment, only a different part from the fifth embodiment will be described. FIG. 14 is an enlarged view of a portion of the electronic control device 1 according to the present embodiment, and corresponds to the portion A shown in FIG. 2. As shown in FIG. 14, the circuit board 10 has the above-described stepped portion 19. The bonding portion 51 is arranged on the stepped portion 19 of the circuit board 10, and the bonding portion 51 and the stepped portion 19 are covered by the adhesion improving member 60.

The clearance and the concavo-convex portion of the bonding portion 51 are filled with the adhesion improving member 60 by the capillary phenomenon so that the adhesion improving member 60 is thickened. Therefore, the peeling resistance is further improved because of the low elasticity of the adhesion improving member 60.

Seventh Embodiment

Figure 15:
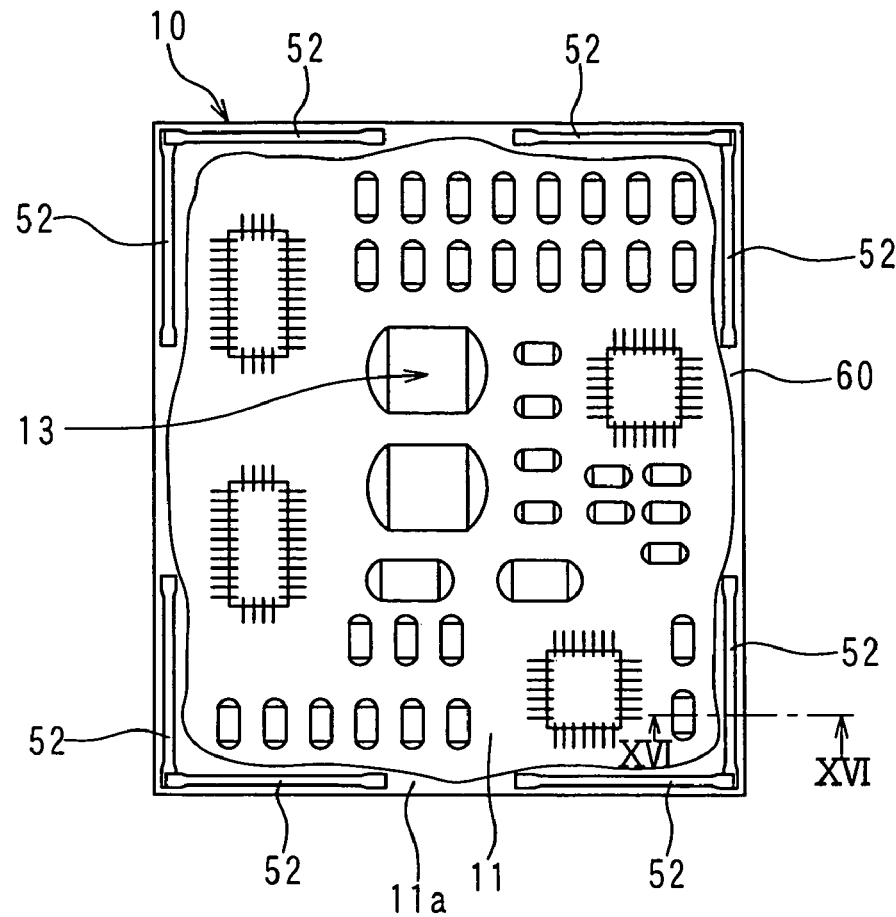
FIG. 15 is a plan view of a circuit board according to a seventh embodiment of the present invention.

In the present embodiment, only a different part from the fifth embodiment will be described. FIG. 15 is a plan view of the circuit board 10 according to the present embodiment. As shown in FIG. 15, a wire 52 made of aluminum or the like is arranged on the outer edge portion 11a of the first surface 11 of the circuit board 10. The wire 52 is strained linearly along each of sides of the circuit board 10. A length of one wire 52 is 15 mm, for example, and two wires 52 are arranged in the form of an L-shape.

The wire 52 is made of an aluminum wire same with the wire used in electrically connecting the electrode of the circuit board 10 to the lead terminal 30. A diameter of the wire 52 is 250 μm, for example.

Figure 16:
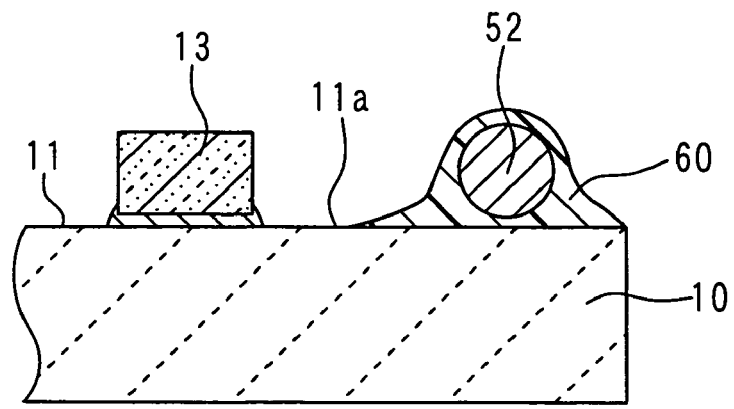
FIG. 16 is a cross-sectional view taken along line XVI-XVI in FIG. 15.

FIG. 16 is a cross-sectional view taken along line XVI-XVI in FIG. 15. As shown in FIG. 16, the adhesion improving member 60 is filled between the wire 52 and the circuit board 10 by the capillary phenomenon. Further, the adhesion improving member 60 forms a fillet between a side surface of the wire 52 and the circuit board 10 so that the adhesion improving member 60 is thickened. Therefore, the peeling stress of the molding resin 40 can be reduced, and further, the reliability in adhesion between the circuit board 10 and the molding resin 40 can be improved.

Moreover, multiple wires 52 may be arranged parallel to one another. In this case, as with the third embodiment, the adhesion improving member 60 is more likely to accumulate between the adjacent wires 52. Thus, more adhesion improving member 60 can be arranged on the outer edge portion 11a of the circuit board 10, and thereby, the peeling stress can be reduced more effectively.

Eighth Embodiment

Figure 17:
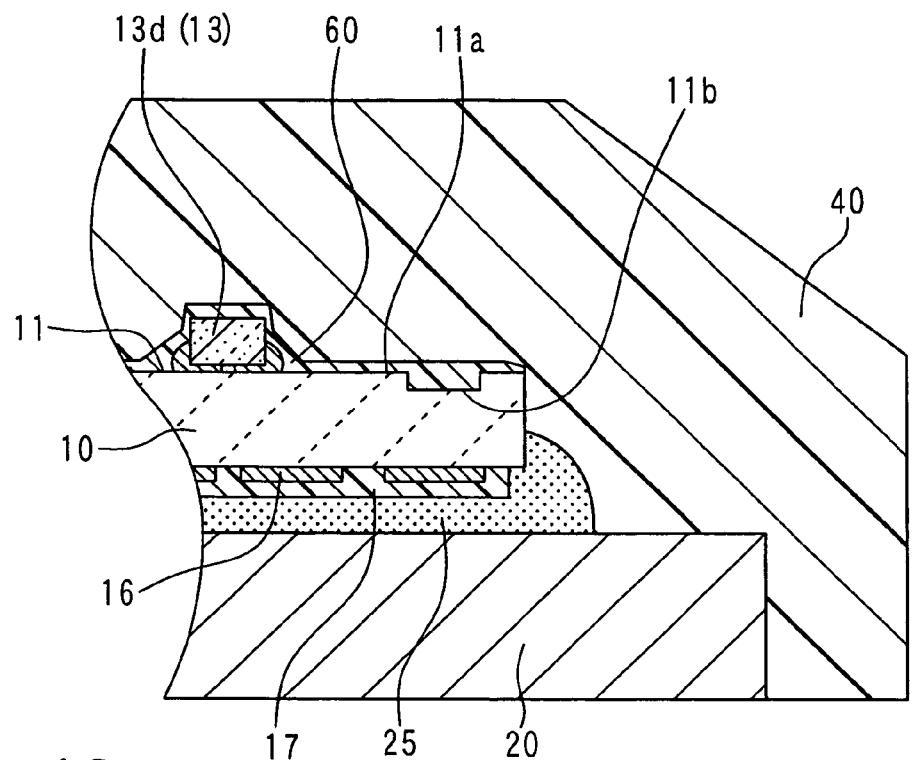
FIG. 17 is an enlarged view of a portion of an electronic control device according to an eighth embodiment of the present invention.

In the present embodiment, only a different part from the above embodiments will be described. FIG. 17 is an enlarged view of a portion of the electronic control device 1 according to the present embodiment, and corresponds to the portion A shown in FIG. 2. As shown in FIG. 17, the circuit board 10 has a concave portion 11b on the outer edge portion 11a of the first surface 11 of the circuit board 10. The adhesion improving member 60 is filled in the concave portion 11b so that the adhesion improving member 60 in the concave portion lib is thickened. Therefore, the peeling stress of the molding resin 40 can be reduced by the adhesion improving member 60.

The concave portion 11b can be formed by hollowing the circuit board 10 made of the ceramic multilayer board. A depth of the concave portion 11b is 200 μm, for example. When the multilayer board constructed of six ceramic boards is used, the concave portion 11b can be formed by hollowing an uppermost layer of the multilayer board.

Ninth Embodiment

Figure 18:
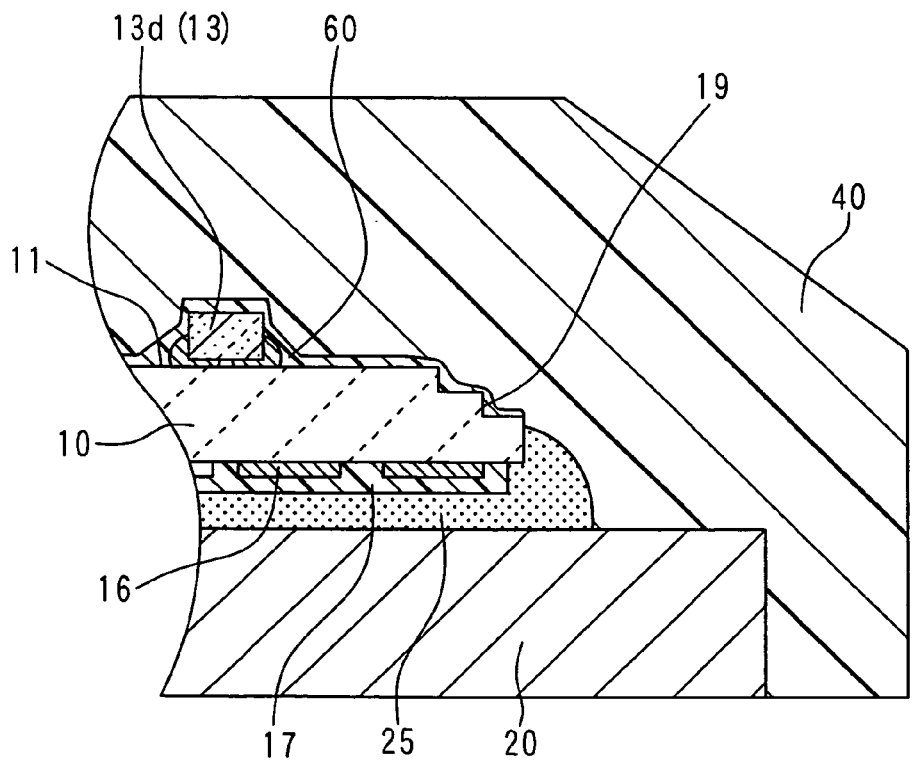
FIG. 18 is an enlarged view of a portion of an electronic control device according to a ninth embodiment of the present invention.

In the present embodiment, only a different part from the above embodiments will be described. FIG. 18 is an enlarged view of a portion of the electronic control device 1 according to the present embodiment, and corresponds to the portion A shown in FIG. 2. As shown in FIG. 18, the circuit board 10 has the above-described stepped portion 19. The adhesion improving member 60 covers concave corner portions formed by the plane portions and the side portions of the stepped portion 19.

In this manner, by arranging the adhesion improving member 60 on the stepped portion 19, the adhesion improving member 60 accumulates at the concave corner portions and forms a fillet so that the adhesion improving member 60 is thickened. Therefore, the peeling stress of the molding resin 40 can be reduced by the thickened adhesion improving member 60.

Further, by forming the stepped portion 19 at the end of the circuit board 10, the peeling stress of the molding resin 40 concentrated at the end of the circuit board 10 can be dispersed. Therefore, the peeling stress can be effectively reduced due to reducing of the stress by the adhesion improving member 60 and dispersing of the stress by the stepped portion 19.

Other Embodiments

In the first to fourth embodiments, the electrically-conductive adhesive 50 having a lower elastic modulus than the circuit board 10 and the molding resin 40 is used. However, the elastic modulus of the electrically-conductive adhesive 50 may be at least lower than that of the circuit board 10. This is because the peeling stress received from the molding resin 40 is reduced as long as the electrically-conductive adhesive 50 is at least softer than the circuit board 10.

In the first to fourth embodiments, the electrically-conductive adhesive 50 is coated with the adhesion improving member 60. However, only the electrically-conductive adhesive 50 may be arranged without providing the adhesion improving member 60. In this case, the electrically-conductive adhesive 50 lowers an elastic modulus of a joint portion between the circuit board 10 and the molding resin 40 at the outer edge portion 11a of the first surface 11 compared to that at an inner side of the outer edge portion 11a of the first surface 11.

In the first to fourth embodiments, the electrically-conductive adhesive 50 is used as the stress reducing portion. However, an insulating resin may be used other than the electrically-conductive adhesive 50. The same material as the insulating film 17 covering the thick film resistor 16 can be used as the insulating resin. For example, a resist such as an ultraviolet curable resin can be used. The insulating resin can be formed on the circuit board 10 based on a method of printing. In this case, the insulating resin may be coated with the adhesion improving member 60 as with the first to fourth embodiments.

In the first to fourth embodiments, the adhesion improving member 60 is arranged all over the first surface 11 of the circuit board 10. However, the adhesion improving member 60 may be arranged only at the outer edge portion 11a as with the fifth embodiment.

In the eighth embodiment, the concave portion 11b for filling the adhesion improving member 60 therein is formed on the circuit board 10. However, a dam is formed at the outer edge portion 11a of the circuit board 10 by printing an electrically-conductive adhesive or an insulating resin, and the adhesion improving member 60 may be filled in the dam.

In the above embodiments, the sintered compact of aluminum and silicon carbide is used as the material of the base member 20. However, at least one of a laminated body made of iron-nickel alloy sandwiched by copper and a sintered compact of copper and cuprous oxide can be used as the base member 20. The laminated body made of iron-nickel alloy sandwiched by copper has a linear expansion coefficient of 4 to 13 ppm/° C., an elastic modulus of 100 to 150 MPa, thermal conductivity in a thickness direction of 15 to 50 W/mK and that in a plane direction of 90 to 320 W/mK. The sintered compact of copper and cuprous oxide has a linear expansion coefficient of 9 to 17.8 ppm/° C., an elastic modulus of 50 to 120 MPa and thermal conductivity of 120 to 380 W/mK. Therefore, the linear expansion coefficient of the base member 20 can be set to be approximately equal to that of the molding resin 40, and the radiation performance can be ensured.

In the above embodiments, the flange portion 21 is formed separately from other components of the base member 20. However, the flange portion 21 may be integrally formed by the same material with the base member 20.

In the above embodiments, the electrically-conductive adhesive 50, the bonding portion 51 and the wire 52 are used as the stress reducing portion. However, a dummy component coated with the adhesion improving member 60 may be used as the stress reducing portion. Because the dummy component has a concavo-convex portion and a clearance, the concavo-convex portion and the clearance are filled with the adhesion improving member 60 by the capillary phenomenon and the adhesion improving member 60 can be thickened.

It is preferable that a chip-shaped elastic body having the same size with "1005" or "0603", each of which is a size of a chip component, is used as the dummy component. The dummy component is arranged on the circuit board 10 in a mounting process of electronic components. The dummy component may be one of the electronic components 13, which are actually mounted in an electric circuit.

In the above embodiments, the electrically-conductive adhesive 50 and the like as the stress reducing portion are arranged on the circuit board 10. However, the electrically-conductive adhesive 50 and the like may be arranged on an outer edge portion of the base member 20. In this case, reliability in adhesion between the base member 20 and the molding resin 40 can be improved.

In the above embodiments, the electrically-conductive adhesive 50, the bonding portion 51, the wire 52 and the like as the stress reducing portion are arranged in the form of the L-shape. However, the electrically-conductive adhesive 50, the bonding portion 51, the wire 52 and the like may be arranged in the other form. FIGS. 19A to 19D are schematic views showing examples of layouts of stress reducing portions. In FIGS. 19A to 19D, examples of layouts of the electrically-conductive adhesive 50 will be described.

Figure 19A:
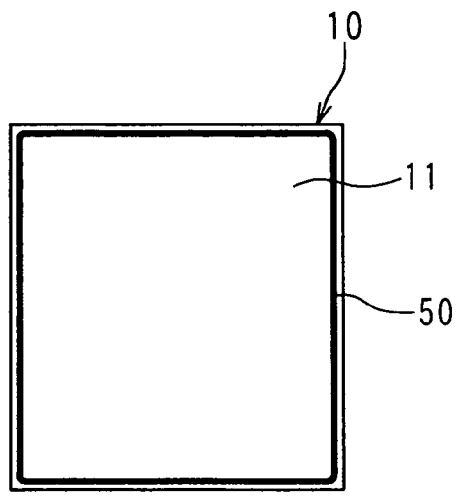
FIGS. 19A to 19D are schematic views showing examples of layouts of stress reducing portions according to another embodiment of the present invention.

As shown in FIG. 19A, the electrically-conductive adhesive 50 can be arranged entirely on the outer edge portion 11a to surround the first surface 11 of the circuit board 10. Thus, the peeling stress can be reduced at an entire circumference of the circuit board 10.

Figure 19B:
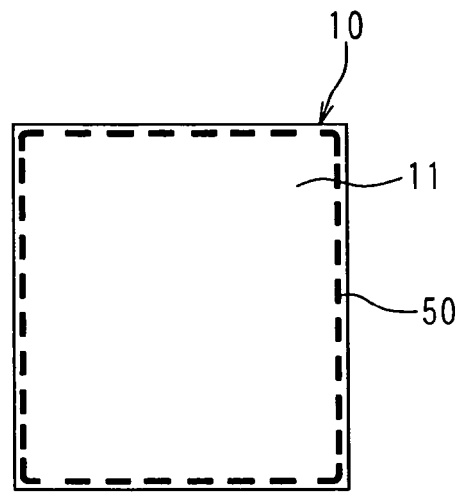
Figure 19C:
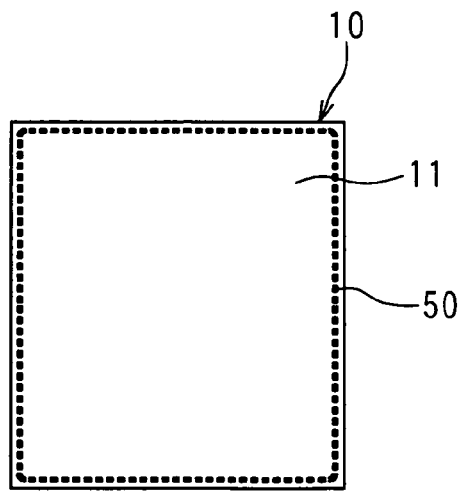

As shown in FIGS. 19B and 19C, the electrically-conductive adhesive 50 can be arranged intermittently on the outer edge portion 11a of the first surface 11. The electrically-conductive adhesive 50 is arranged in the form of a broken line in FIG. 19B and is arranged in the form of a dotted line in FIG. 19C. The intermittent electrically-conductive adhesive 50 can be formed by a method of printing.

Figure 19D:
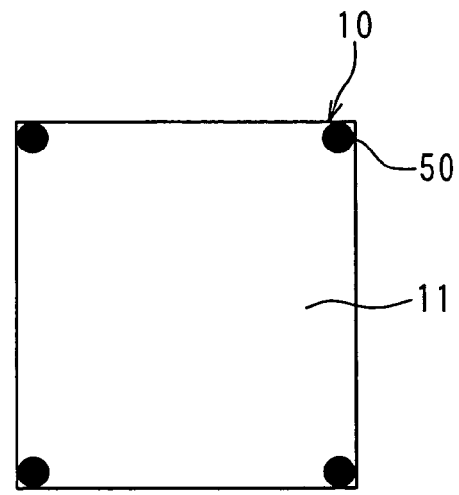

Further, as shown in FIG. 19D, the electrically-conductive adhesive 50 can be arranged on the outer edge portion 11a of the first surface 11 in a dot shape. Specifically, it is preferable that the electrically-conductive adhesive 50 is arranged at four corners located farthest from the center of the first surface 11.

Moreover, the point-like electrically-conductive adhesive 50 shown in FIG. 19D may be combined with the respective layouts of the electrically-conductive adhesive 50 shown in FIGS. 19A to 19C. It is to be noted that the layouts shown in FIGS. 19A to 19D are not limited to the electrically-conductive adhesive 50, and can be applicable to the bonding portion 51 and the wire 52.

Each of the embodiments can be combined. For example, in the seventh embodiment, the stepped portion 19 is formed on the circuit board 10, the wire 52 is arranged on the stepped portion 19, and the wire 52 is coated with the adhesion improving member 60.

Figure 20:
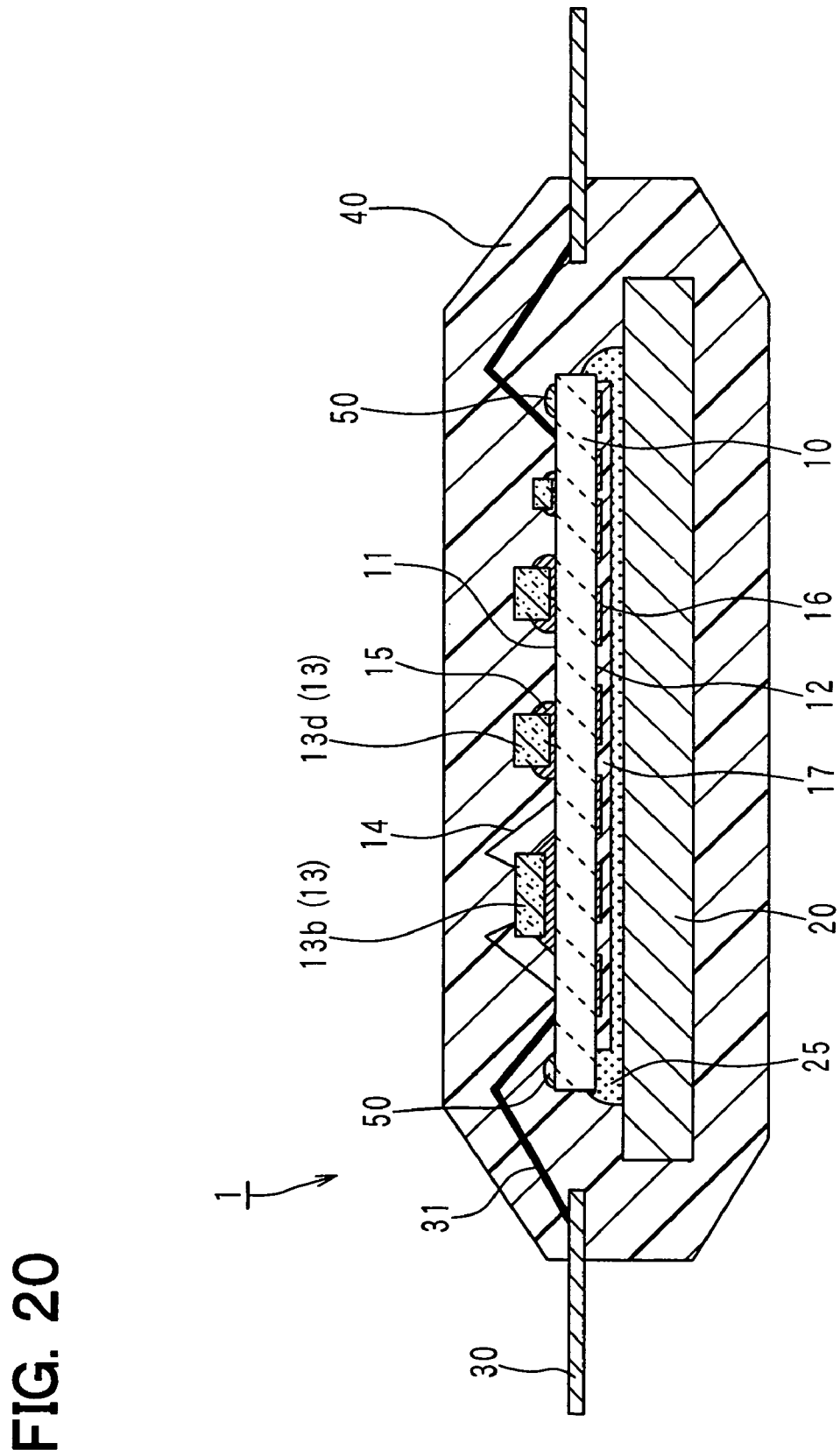
FIG. 20 is a cross-sectional view of an electronic control device having a full mold structure according to another embodiment of the present invention.

Furthermore, in the above embodiments, the electronic control device 1 has the half mold structure, in which a part of the base member 20 is exposed from the molding resin 40. However, the electronic control device 1 may have a full mold structure as shown in FIG. 20. In the full mold structure, an opposite surface of a surface of the base member 20 to which the circuit board 10 is fixedly bonded is also molded, that is, the base member 20 is entirely molded. In this case, the radiation performance is decreased. However, both surfaces of the base member 20 are covered by the molding resin 40, so that contraction of the electronic control device 1 can be balanced as a whole, a warpage of a molded object can be prevented, and the stress at an interface of the molding, resin 40 is decreased. Then, by arranging the electrically-conductive adhesive 50 as the stress reducing portion at least on the outer edge portion 11a of the first surface 11, a large-size molded component having a length of one side of more than 60 mm, for example, can be obtained.

Figure 21:
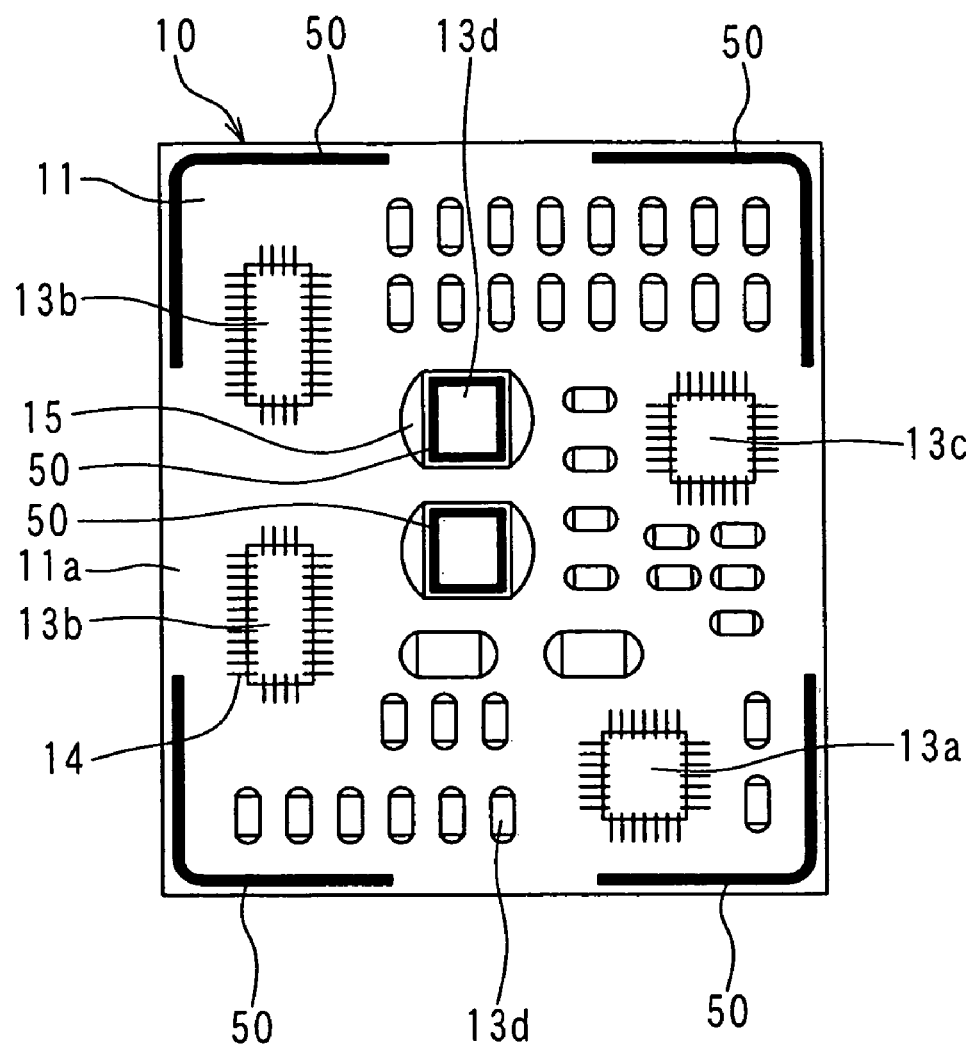
FIG. 21 is a plan view of a first surface of a circuit board according to another embodiment of the present invention.

Further, the electrically-conductive adhesive 50 as the stress reducing portion can be arranged not only on the outer edge portion 11a of the first surface 11 but also on a portion at which the great stress is applied as shown in FIG. 21. The electrically-conductive adhesive 50 is arranged on the electronic components 13 in FIG. 21. Examples of the portion at which the great stress is applied include an outer edge portion of a first surface or a corner portion of (1) a large-size component (the stress is increased due to the difference between an amount of heat contraction of the large-size component and that of the molding resin 40) and (2) a component having a linear expansion coefficient and the amount of heat contraction that greatly differ from those of the molding resin 40.

As the stress reducing portion, high-viscosity polyamide-imide, which is used as the adhesion improving member 60, obtained by lowering the dilution ratio thereof can be used other than the electrically-conductive adhesive 50. Because the high-viscosity polyamide-imide is an insulating material unlike the electrically-conductive adhesive 50, the high-viscosity polyamide-imide can be arranged not only on the outer edge portion 11a of the first surface 11 but also on a whole area on which the electronic components 13 are mounted. Here, the outer edge portion 11a indicates a periphery portion on which the electronic components 13 are not mounted, and the periphery portion is located about 0.5 to 2 mm apart from the end of the circuit board 10. The peeling stress of the molding resin 40 is increased with increasing distance from the center of the first surface 11 of the circuit board 10. In this case, a region on which the stress reducing portion is not arranged is diminished, that is, a region on which the stress reducing portion is arranged can be enlarged. Thus, peeling of the molding resin 40 can be reduced.

While the invention has been described with reference to preferred embodiments thereof, it is to be understood that the invention is not limited to the preferred embodiments and constructions. The invention is intended to cover various modification and equivalent arrangements. In addition, while the various combinations and configurations, which are preferred, other combinations and configurations, including more, less or only a single element, are also within the spirit and scope of the invention.

What is claimed is:

1. An electronic control device comprising:
a circuit board having a first surface and a second surface that is an opposite surface of the first surface;
a base member that forms a heat sink, wherein the base member has a circuit board side surface, to which the second surface of the circuit board is bonded;
an electronic component mounted on the first surface;
a molding resin that entirely seals the circuit board and the circuit board side surface of the base member; and
a stress reducing portion arranged at least on an outer edge portion of the first surface of the circuit board, wherein:
the stress reducing portion is held between the circuit board and the molding resin to reduce stress of a joint portion between the circuit board and the molding resin via the stress reducing portion at the outer edge portion in comparison to stress of a joint portion between the circuit board and the molding resin which are bonded together without holding the stress reducing portion there between;
an elastic modulus of the stress reducing portion is lower than an elastic modulus of the circuit board;
the stress reducing portion is made of an electrically-conductive adhesive;
the electronic component is bonded to the first surface of the circuit board by an electrically-conductive adhesive, which is the same as the electrically-conductive adhesive of the stress reducing portion; and
an adhesion improving member, which has an elastic modulus lower than an elastic modulus of the electrically-conductive adhesive of the stress reducing portion and an elastic modulus of the molding resin, is interposed between the electrically-conductive adhesive of the stress reducing portion and the molding resin and contacts the electrically-conductive adhesive of the stress reducing portion and the molding resin.

2. The electronic control device according to claim 1, wherein
the stress reducing portion is arranged at a region farthest from a center of the first surface in the outer edge portion of the first surface.

3. The electronic control device according to claim 1, wherein
the circuit board has a stepped portion configured by a plane portion and a side portion at the outer edge portion of the first surface, and
the stress reducing portion is arranged to cover the stepped portion.

4. The electronic control device according to claim 1, wherein
the stress reducing portion is arranged to cover a corner portion configured by the first surface and a lateral surface adjacent to the first surface.

5. The electronic control device according to claim 1, wherein
the stress reducing portion is coated with the adhesion improving member, which firmly attaches the molding resin to the circuit board.

6. The electronic control device according to claim 1, wherein
the stress reducing portion is arranged in the form of L-shape on the outer edge portion of the first surface.

7. The electronic control device according to claim 1, wherein
the stress reducing portion is arranged entirely on the outer edge portion to surround the first surface.

8. The electronic control device according to claim 1, wherein
the stress reducing portion is arranged intermittently on the outer edge portion of the first surface.

9. The electronic control device according, to claim 1, wherein
the stress reducing portion is arranged on the outer edge portion of the first surface in a dot shape.

10. The electronic control device according to claim 1, wherein an opposite surface of the base member, which is opposite from the circuit board side surface of the base member in a direction perpendicular to a plane of the circuit board side surface of the base member, is exposed from the molding resin.

11. The electronic control device according to claim 1, wherein:
the electrically-conductive adhesive is silver paste; and
the adhesion improving member is made of polyamide-imide.

12. The electronic control device according to claim 1, wherein
the elastic modulus of the stress reducing portion is lower than the elastic modulus of the molding resin.

* * * * *